(12) United States Patent
Vanden Bossche

(10) Patent No.: US 9,804,226 B2
(45) Date of Patent: Oct. 31, 2017

(54) DEVICE FOR ACTIVELY IMPROVED IMPEDANCE SYNTHESIS

(71) Applicant: NATIONAL INSTRUMENTS IRELAND RESOURCES LIMITED, Dublin (IE)

(72) Inventor: Marc Vanden Bossche, Bornem (BE)

(73) Assignee: NATIONAL INSTRUMENTS IRELAND RESOURCES LIMITED, Dublin (IE)

(*) Notice: Subject to any disclaimer, the term of this patent is extended or adjusted under 35 U.S.C. 154(b) by 63 days.

(21) Appl. No.: 14/053,030

(22) Filed: Oct. 14, 2013

(65) Prior Publication Data

US 2014/0103946 A1   Apr. 17, 2014

Related U.S. Application Data

(60) Provisional application No. 61/713,054, filed on Oct. 12, 2012.

(51) Int. Cl.
*G01R 31/319*   (2006.01)
*G01R 31/28*    (2006.01)
*G01R 27/28*    (2006.01)

(52) U.S. Cl.
CPC ....... *G01R 31/319* (2013.01); *G01R 31/2822* (2013.01); *G01R 27/28* (2013.01)

(58) Field of Classification Search
CPC .................................................. G01R 31/319

(Continued)

(56) References Cited

U.S. PATENT DOCUMENTS 4,803,419 A * 2/1989 Roos ............................ 324/642
6,930,564 B2 * 8/2005 Verspecht ..................... 333/1.1

(Continued)

FOREIGN PATENT DOCUMENTS

CN         1206513 C   *   6/2005

OTHER PUBLICATIONS

Ferrero, Andrea Pierenrico; Teppati, Valeria "Active and Passive Load Pull Systems: From the Basic to the Future of Variable Impedance Device Characterization" IEEE International Microwave Symposium; Jun. 12, 2005; 20 pages.

(Continued)

*Primary Examiner* — Jermele M Hollington
*Assistant Examiner* — Zannatul Ferdous
(74) *Attorney, Agent, or Firm* — Meyertons Hood Kivlin Kowert & Goetzel, P.C.; Jeffrey C. Hood

(57) ABSTRACT

An impedance control device for tuning a device under test comprising: a first terminal port arranged for connecting a device under test, a second terminal port arranged for connecting a termination, a first signal path for a signal travelling between the first and the second terminal port, first coupling means arranged for picking up a part of the signal travelling in the first signal path, a second signal path arranged for receiving the part of the signal from the first coupling means, said second signal path comprising a correction circuit for adapting as a function of frequency the amplitude and phase of the received part of the signal, second coupling means arranged for coupling back into the first signal path an adapted signal outputted by the correction circuit, and an attenuator and phase shifter for applying attenuation and phase shifting on the signals travelling between the first and the second terminal port.

8 Claims, 4 Drawing Sheets

(58) Field of Classification Search
USPC .................................................. 324/750.01
See application file for complete search history.

(56) References Cited

U.S. PATENT DOCUMENTS

| | | | |
|---|---|---|---|
| 7,646,267 B1* | 1/2010 | Tsironis | 333/263 |
| 2003/0058058 A1* | 3/2003 | Verspecht et al. | 333/17.3 |
| 2007/0052505 A1* | 3/2007 | Simpson | H01P 1/127 333/263 |
| 2007/0182424 A1* | 8/2007 | Benedikt | G01R 31/2822 324/637 |

OTHER PUBLICATIONS

Z. Abousch; C. Jones; G. Knight; A. Sheikh; H. Lee; J. Lees; JE. Benedikt; and P.J. Tasker "High Power Active Harmonic Load-Pull System for Characterization of High Power 100Watt Transistors" European Microwave Conference; Oct. 4-6, 2005; 4 pages; vol. 1.
Focus Microwaves: Microwave tuner and noise measurement specialists; retrieved Feb. 6, 2014; 2 pages; Obtained from Internet: http://www.focus-microwaves.com/;.
Your Best Solution for Advanced Microwave Measurements; retrieved Feb. 6, 2014; 1 page; Obtained from Internet: http://www.hfemicro.com/home.html.
Maury Microwave—Manual Tuners / Impedance Tuners; retrieved Feb. 6, 2014; 2 pages; Obtained from Internet: http://www.maurymw.com/MW_RF/Manual_Tuners.php.

* cited by examiner

DEVICE FOR ACTIVELY IMPROVED IMPEDANCE SYNTHESIS

PRIORITY CLAIM

The present application claims benefit of priority to provisional Application No. 61/713,054 titled "Actively Improved Impedance Synthesis filed on Oct. 12, 2013, which is hereby incorporated by reference as though fully and completely set forth herein.

FIELD OF THE INVENTION

The present invention is related to the field of radio frequency (RF) and microwave measurement technology. More precisely, it relates to the characterization of a device under test (DUT) under different impedance conditions.

BACKGROUND OF THE INVENTION

Impedance control devices, also called tuners, are devices of which the impedance, presented to the outside world, can be changed. This is done by either manually changing a device property (e.g. a manual tuner, see e.g. http://www-.maurymw.com/MW_RF/Manual_Tuners.php) or by changing a property via an electronic means (e.g. an automated tuner, see http://www.focus-microwaves.com). The device typically has one port or two ports, but can in principle have more ports, e.g. a tuner for differential devices. Via the port these devices are connected to the outside world and provide a controllable impedance to the device under test (DUT). In most cases, a port is a physical connector through which the impedance control device can be connected to another device. However, the port does not need to be limited to a connector. The port defines a boundary between the impedance control device and the outside world. Amongst other things, a port can be a pad of an integrated circuit (IC) or a location on a line on a PCB. The impedance range the impedance control device can provide depends on the physical properties of the device.

Impedance control devices are well established in source- and load-pull measurement set-ups or measurement systems. These set-ups are used to determine the impedances to be presented at the input and/or output of a device under test in order to optimize one or more of its performance characteristics, e.g. the delivered output power, power added efficiency and other. In this case the device under test is typically a transistor or an amplifier under test. These set-ups are also used to characterize the behaviour of devices, e.g. transistors, diodes, amplifiers, mixers etc. . . . under realistic test conditions or to verify and/or improve their model, used in computer aided engineering (CAE) tools.

The impedance control devices, which are presently used in commercially available source- and load-pull systems, are based on various techniques. As measurement means, these source- and load-pull systems use different types of measurement receivers: one or more power meter, spectrum analyzer, network analyzer, oscilloscope, . . . .

First, there are the passive impedance control devices. They are based on one or more moveable resonator or slug. These tuners usually are bulky due to the mechanical aspects, while shrinking in size with increasing frequency due to reduced wavelength. As such they take a lot of space in a measurement set-up. To move the resonator(s) or slug(s) automatically, tuners contain step motors. As these parts are moving to synthesize a new impedance, the tuners can cause vibrations in the measurement set-up. This is typically a problem for on-wafer measurements. The use of pin diodes, positioned at different positions of transmission line stubs, has been an alternative to synthesize impedances in a passive way. This approach results in smaller form factors, eliminating the step motors, but is presently limited to power levels up to approximately 35-40 dBm. The working principle is based on creating reflections on a transmission line at different positions by turning on or off the pin diodes at these positions. As such the size is dependent on the frequency range. Pin diodes can be switched on and off very fast. Consequently impedances can be tuned fast.

Secondly, there are the active tuners. Two types of active tuners do exist: closed loop and open loop. With the closed loop approach, the tuner senses the output power of the device under test (DUT), amplify or attenuate it and shift it in phase and re-inject this signal towards the device under test as reflected wave. Meanwhile proper selection in topology and narrowband filtering in the loop minimizes the risk of oscillation. These set-ups usually are bulky because the couplers, amplifiers, attenuators, filters and phase shifters are connectorized devices.

With the open loop approach power is actively injected towards the DUT output in a phase coherent way with the source that provides the input signal to the device under test. This can be realized in different ways, e.g. by splitting the input source, followed by amplifying or attenuating and phase shifting it (as in the presentation "*Active and passive load-pull systems: from the basic to the future of variable impedance device characterization*", A. Ferrero et al, PAF, pp. 13-14, IMS 2005 Workshop WSG), or by using a second source which is controllable in amplitude and phase and phase locked to the source at the input (see "*High power active harmonic load-pull system for characterization of high power 100-watt transistors*", Z. Aboush et al., EUMC 2005, Proc. Vol. 1). For both approaches, the signal injected back to the device under test is amplified or attenuated and controlled in phase compared to the signal that comes out of the device under test. In this way synthetically different impedances can be synthesized. A similar approach can be used to synthesize impedances at the input of the device under test, typically at harmonics of the input source. Also this set-up is bulky requiring splitters, possibly a second source, amplifiers, phase control, possibly filters etc. . . . . . .

Further impedance control devices are available which operate based on a combination of passive and active tuning. Reference is made to the web sites of Focus Microwave (www.focus-microwave.com) and HFE (www.hfemicro.com).

Commercially available set-ups, provided with an impedance control device, minimally contain a source to stimulate the device under test, the DUT itself, followed by a tuner and a means (e.g. a power meter) to measure the power transmitted by the DUT under different impedance conditions, as illustrated in FIG. 1.

Further extended set-ups also use power measurement capability at the input to measure input power, possibly in combination with a source tuner and the capability to measure reflected power at the input, a spectrum analyzer at the output to perform frequency selective power measurements and to monitor stability. Another exemplary set-up is shown in FIG. 2.

If one wants to measure more information at the DUT, it is possible to use a vector network analyser, an oscilloscope or a receiver with similar capabilities in combination with signal separation hardware that can detect samples of the incident and reflected waves (or a combination thereof).

In set-ups to measure the incident and reflected waves or a combination thereof, typically in a frequency-selective way, the signal separation hardware can be put (see FIG. 3) outside the combination of device under test and tuner (after the DUT and tuner) or between the DUT and the tuner (FIG. 4). With the first configuration (FIG. 3) one needs to use the S-parameters of the tuner to properly de-embed the measurements up to the device under test as the impedance is being changed. With the second configuration (FIG. 4) the incident and reflected waves or a combination thereof are always measured at the DUT, independently of the tuner position. One selects signal separation hardware that minimizes the losses between the DUT and the tuner, as the losses reduce the coverage area of the Smith chart.

SUMMARY OF THE INVENTION

Embodiments of the present invention may operate to provide a device capable of synthesizing impedances suitable for, amongst other things, small and medium sized devices on a printed circuit board.

In a first aspect the invention relates to an impedance control device for tuning a device under test comprising a first terminal port arranged for connecting a device under test, a second terminal port arranged for connecting a termination, a first signal path for a signal travelling between the first and the second terminal port, first coupling means arranged for picking up a part of the signal travelling in the first signal path, a second signal path arranged for receiving the part of the signal from the first coupling means, said second signal path comprising a correction circuit for adapting as a function of frequency the amplitude and phase of the received part of the signal, second coupling means arranged for coupling back into the first signal path an adapted signal outputted by the correction circuit, an attenuator and phase shifter for applying attenuation and phase shifting on the signals travelling between said first and said second terminal port.

The proposed solution adds a parallel path to the branch or signal path containing a variable attenuator and phase shifter in order to correct the wave reflected towards the DUT or the wave transmitted from the DUT such that a required reflection or impedance at the device under test can be synthesized. The principle is to use the attenuator and phase shifter to set the reflection factor and to use the second signal path for corrections to realize the required reflection factor. The solution according to the invention proposes synthesizing the requested reflection factor by tapering of the wave with some coupling means coming from the DUT or the wave going to the DUT, correcting the amplitude and phase of the tapered wave (filtering and amplification) using analogue and/or digital means, either at one frequency, multiple frequencies or as function of frequency and coupling the adapted wave or signal back in the first signal path towards the device under test or away from the device under test. The correction circuit preferably comprises filtering and/or amplification means to perform an appropriate adaptation of amplitude and phase.

In a preferred embodiment the attenuator and the phase shifter are a part of the first signal path. In that case the second signal path may only contain the correction circuit.

Preferably the attenuator and the phase shifter are positioned outside the signal path between the first and second coupling means. Note that in any embodiment the position of the attenuator and the phase shifter are interchangeable.

In another embodiment the correction circuit further comprises an amplification means.

In yet another preferred embodiment the correction circuit comprises digital synthesis means for correcting the amplitude and phase response of the impedance control device as function of the frequency. In an advantageous embodiment said digital synthesis means is implemented at least in part with a field programmable gate array.

In another advantageous specific embodiment the correction circuit comprises a processing unit for correcting the amplitude and phase response of the impedance control device as function of the frequency.

The invention further also relates to a vector network analyser comprising an impedance control device as previously described.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
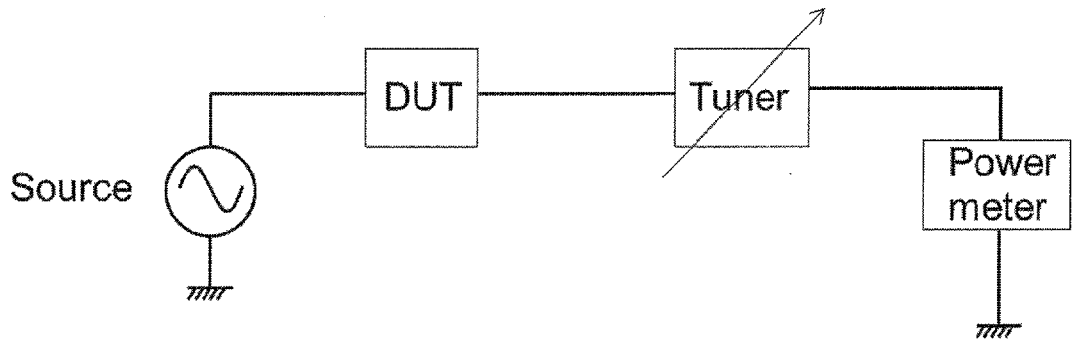
FIG. 1 represents a minimal load-pull system.
Figure 2:
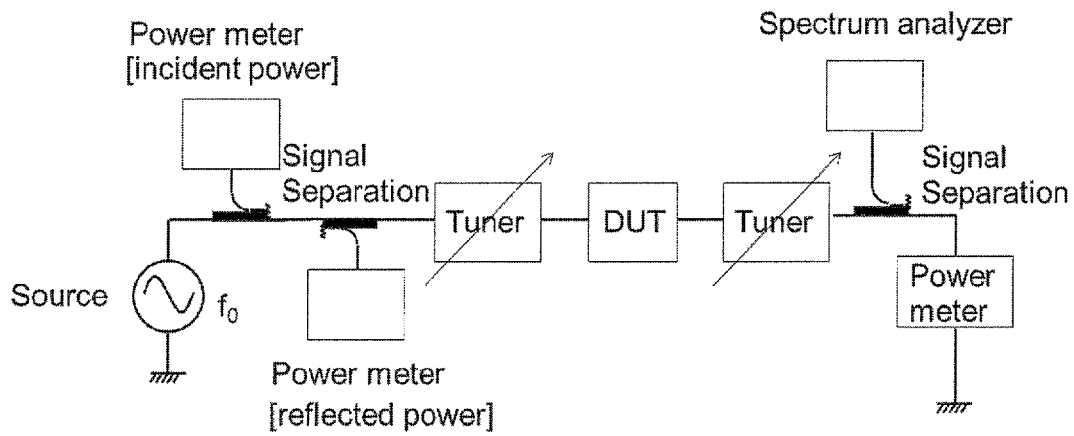
FIG. 2 illustrates a classic load-pull system, measuring power at input and output as well as output spectrum.
Figure 3:
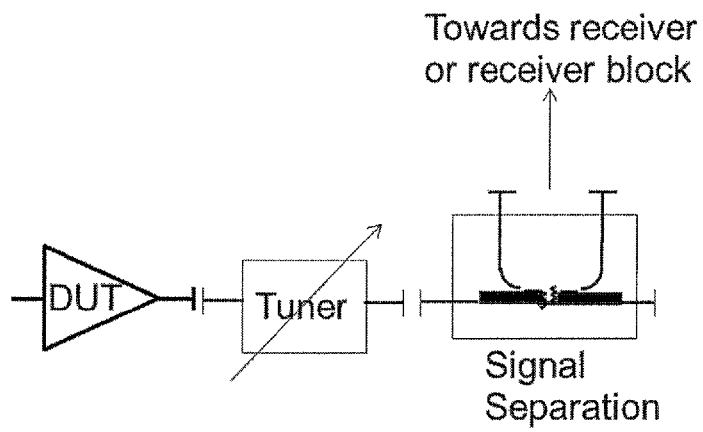
FIG. 3 illustrates a setup measuring transmitted and reflected waves after the combination of DUT and tuner.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 5:
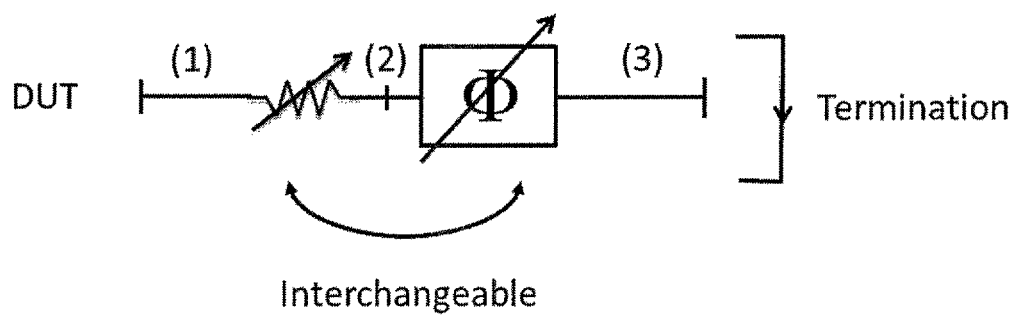
FIG. 5 illustrates a tuning approach with an attenuator and a phase shifter.

There is another way of tuning which is usually not used because the tuning device cannot be followed by a power sensor to measure the delivered power. Also with this method additional losses come along that limit the amplitude of the realizable reflection factor. Nevertheless a tuning device adapted for applying that approach will be presented here because with the new trend of load-pull, low-loss couplers are put between the device under test and the tuner in combination with a receiver to measure the waves travelling between the device under test and the tuner. The invention aims to propose an approach to overcome the loss problem. Using the couplers with receivers it is possible to determine the impedance presented to the device under test and to calculate the delivered output power. The tuning device comprises a variable attenuator and a variable phase shifter terminated in a high reflective load or termination, e.g. an open or a short. The tuning device synthesizes an impedance at the device under test to which it is connected (FIG. 5). The wave coming out of a device under test, e.g. typically a transistor or amplifier, gets attenuated and phase shifted, or vice versa depending on the order of the components, travelling to the termination. Being reflected from the load it gets again phase shifted and attenuated before hitting the device under test. In case the attenuation would be zero and there would be no additional losses and the termination is an open or a short, the phase shifter realizes an impedance on the edge of the Smith Chart with a reflection amplitude of 1. When the attenuator is increased one deviates from the edge towards the center. A variable phase shifter rotates the reflection around the Smith Chart. Ideally the phase shifter should allow a rotation of 360 degrees. In this way impedances can be synthesized on the complete Smith Chart. It is to be noted that the physical position of variable attenuator and variable phase shifter can be always interchanged. Also for limited tuning capability one can decide to use a fixed attenuation or a fixed phase shift. Of course any path to connect to the device under test and to connect the parts of the tuner together, including the termination, causes loss. As such even when the attenuator is set to zero the amplitude of the reflection coefficient is less than 1. The innovation presents a set of techniques to overcome that loss specifically for this approach and to realise reflection factors of amplitude 1 (and possibly above). As such due to this invention the use of a variable attenuator and phase shifter to synthesize impedances becomes a viable tuning technique.

As said one will always face some losses even when the attenuator has been put to zero. The invention proposes to add a parallel signal path to the path with attenuator and phase shifter with some corrective circuitry that will compensate for the losses and possible phase distortions such that the complete structure behaves as a structure with an ideal attenuator, phase shifter and possible delay line.

Figure 6:
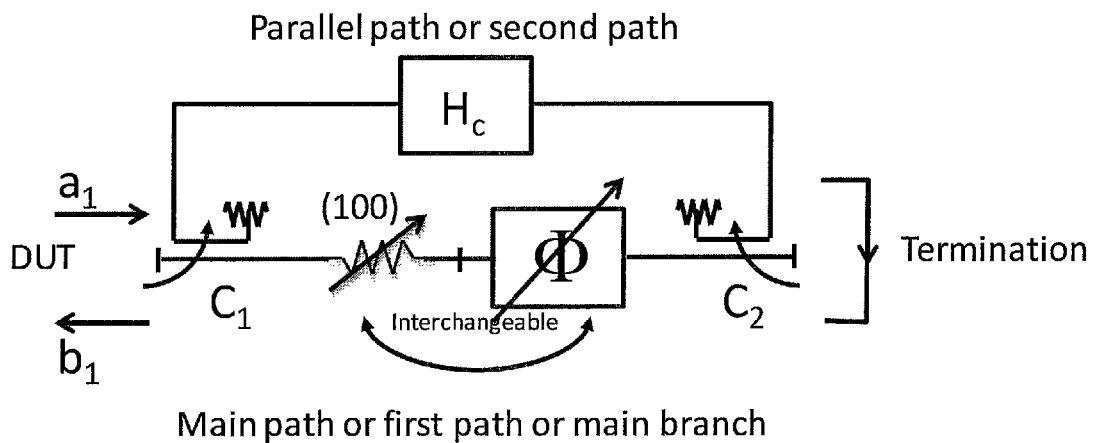
FIG. 6 illustrates an embodiment of the solution according to the invention.

The solution presented in this invention elaborates on the scheme of FIG. 5. More in particular, it proposes to add a parallel path to the branch containing the variable attenuator and phase shifter in order to correct the wave reflected towards the DUT or the wave transmitted from the DUT such that a required reflection or impedance at the device under test can be synthesized. The principle applied in this invention is to use the attenuator and phase shifter to set the reflection factor as closely as possible to the required reflection factor. Due to unwanted losses and phase shifts one cannot always synthesize the requested impedance, definitely not close to the edge of the Smith Chart. The solution according to the invention proposes to synthesize the requested reflection factor by tapering of the wave coming from the DUT or the wave going to the DUT, correcting the amplitude and phase of the tapered wave (filtering and amplification) using analogue and/or digital means, either at one frequency, multiple frequencies or as function of frequency and coupling the adapted wave or signal back in towards the device under test or away from the device under test. FIG. 6 represents an embodiment of this scheme, where $H_c$ represents the analogue and/or digital means to adapt the tapered wave. The coupling of the waves is represented in FIG. 6 by coupler structures with coupling factors C1 and C2, respectively. To taper off the waves or signals one does not need to limit oneself to couplers. One recognizes three distinct locations where one can taper off the waves ((1), (2) or (3)—FIG. 5). One can taper off the wave traveling from the device under test or the wave traveling towards the device under test at these three locations. Similarly, after adapting the tapered wave one can couple the adapted wave back into the first signal path. This can happen again on the three distinct locations ((1), (2) or (3)—FIG. 5). In practice not all combinations are equally practical and some do have practical disadvantages. As such it is clear that some embodiments are preferred over other embodiments.

For example, the scheme shown in FIG. 6 has an important drawback. For certain phase settings of the variable phase, the parallel path can improve the reflected wave properly but for other phase settings, it will actually further degrade the reflected signal and further reduce the maximal attainable reflection factor (Equation 1—termination is assumed to be an open and no additional losses are assumed for the sake of simplicity of the explanation, the transfer characteristic of the attenuator (100) is represented by att). This is due to the fact that one adds two vectors (att $\exp^{j\Phi}+C_1C_2H_c$), one of which is fixed (the parallel branch—($C_1C_2H_c$)) and the other is variable in phase, possibly over 360 degrees (the main branch—(att $\exp^{j\Phi}$).

$$b_1 = \text{att} \exp^{j\Phi}(\text{att} \exp^{j\Phi} + C_1C_2H_c)a_1 \quad \text{(Equation 1)}$$

Figure 7:
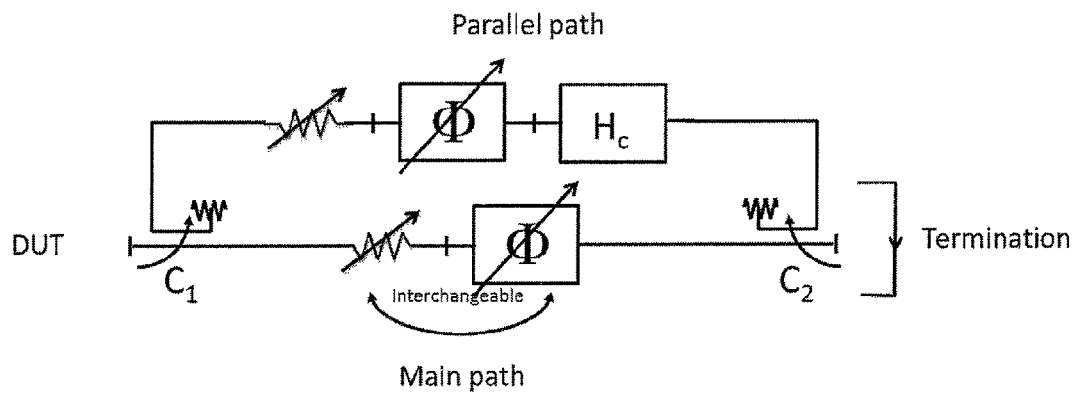
FIG. 7 illustrates an embodiment with an attenuator and phase shifter in the parallel branch.

This can be solved by putting a similar variable attenuator and variable phase shifter in the parallel branch as in the main branch (FIG. 7). Now the variable phase and attenuator are multiplied by the correction factor (Equation 2). As such the impact of the correction is independent of the position of the attenuator and phase shifter. Positions of the attenuator and the phase shifter in each branch remain interchangeable.

$$b_1 = \text{att}^2 \exp^{j2\Phi}(1 + C_1C_2H_c)a_1 \quad \text{(Equation 2)}$$

Figure 8:
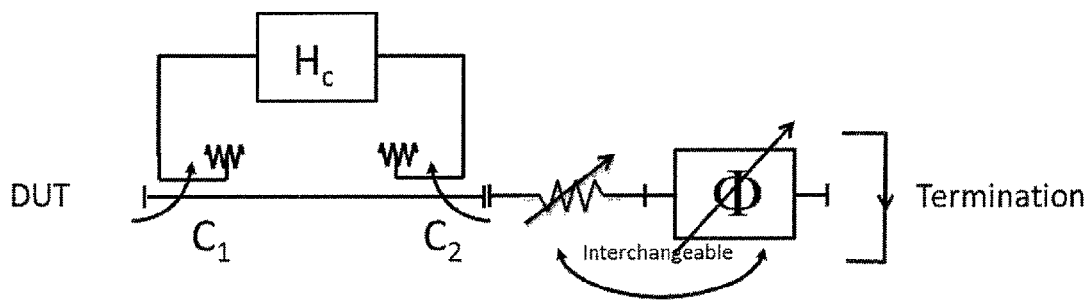
FIG. 8 illustrates an embodiment where the two paths share the attenuator and phase shifter and the correction circuitry is at the device port.
Figure 9:
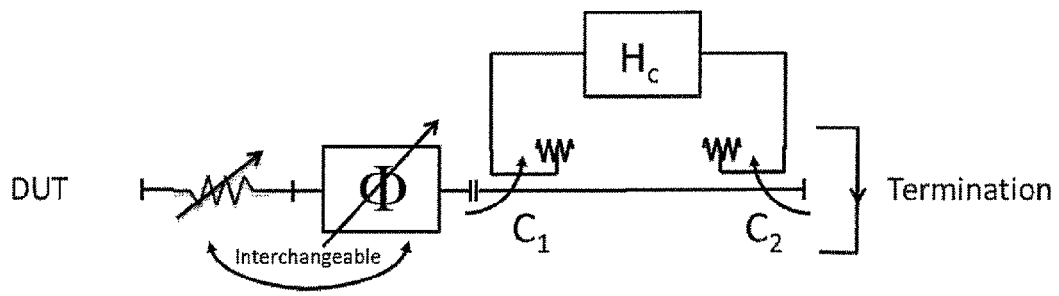
FIG. 9 illustrates an embodiment where the two paths share the attenuator and phase shifter and the correction circuitry is at the termination port.

In the scheme presented in FIG. 7 one needs two similar variable attenuators and two similar variable phase shifters, which clearly is inefficient in terms of cost and also very difficult to realize. This can be resolved based on the same principle of the invention by using an advantageous topology as represented in FIG. 8 and FIG. 9. In FIG. 8 and FIG. 9 the variable attenuator and phase shifter are positioned in a common path outside the parallel branch such that the effect of correction is independent of the value of the attenuator and the phase shifter. In other words, the attenuator and phase shifter are not positioned in between the two coupling means. It is easily seen that the only difference between the circuits of FIG. 8 and FIG. 9 lies in the position of the attenuator and phase shifter with respect to the parallel branch. It is even possible to put the structure with the parallel branch between the attenuator and the phase shifter. The topology of FIG. 9 has the advantage that the power going into the parallel branch is lower than in FIG. 8 and as such the risk of driving the corrective circuitry into compression is lower. An alternative topology can be to reverse the amplifiers such that the signal travelling towards the device under test gets amplified instead of the signal traveling away from the device under test.

Figure 10:
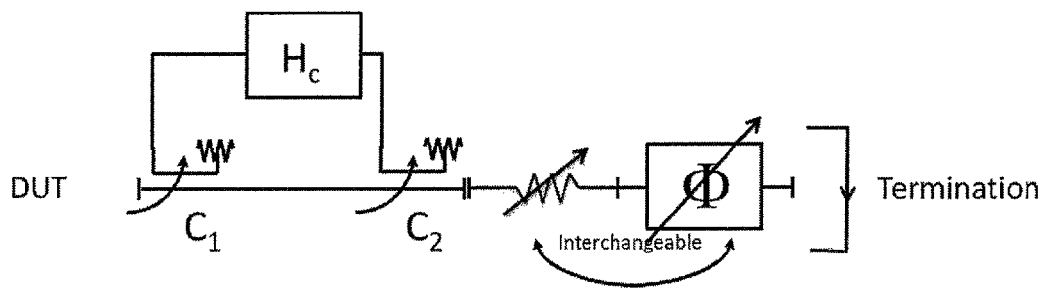
FIG. 10 illustrates an alternative embodiment to FIG. 8 where the adapted signal is injected towards the device under test.
Figure 11:
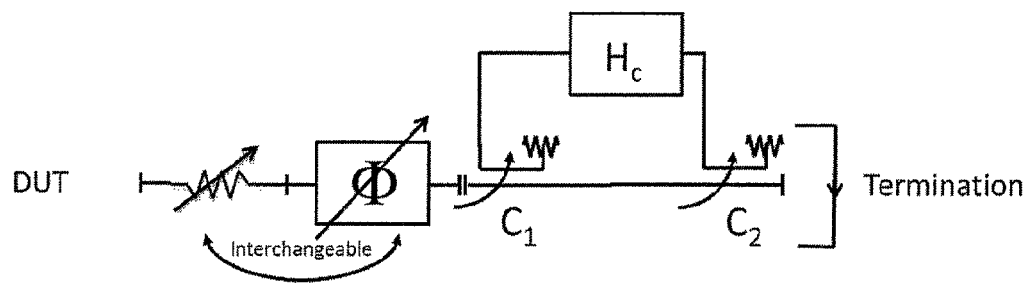
FIG. 11 illustrates an alternative embodiment to FIG. 9 where the adapted signal is injected towards the device under test.

FIG. 10 and FIG. 11 present variations of FIG. 8 and FIG. 9. These variations also apply the principle of the invention. The difference here is that the adapted wave is coupled back into the first path in the direction towards the device under test. Because one purpose of the correction circuitry is to increase the power to compensate for unwanted losses, this topology locally creates a feedback loop with a reflection higher than one which contributes negatively to the risk of oscillation.

Depending on the selected topology, the risk of oscillation is higher. The topologies in FIG. 8 and FIG. 9 do amplify the signal traveling away from the device under test and do not create a direct feedback loop. The topologies, described in FIG. 10 and FIG. 11, have a risk for oscillation due to the feedback loop. Obviously, the corrective circuitry ($H_c$) must in that case be designed properly to increase stability, e.g. a narrowband filter can be used when synthesizing impedances at one frequency. If one works only at one frequency (under continuous wave excitation) it is easier to design the corrective filter/amplifier ($H_c$). If one works under modulation excitation, the design of this corrective filter/amplifier ($H_c$) is a more difficult task because it needs to correct for the unwanted losses and possibly unwanted phase ripple across the bandwidth of interest.

Figure 12:
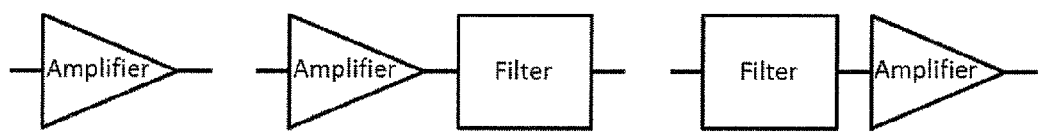
FIG. 12 illustrates different embodiments of the corrective circuitry.
Figure 12:
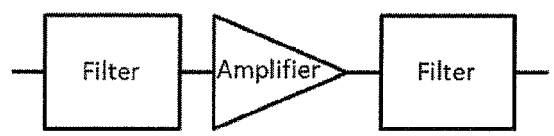
Figure 13:
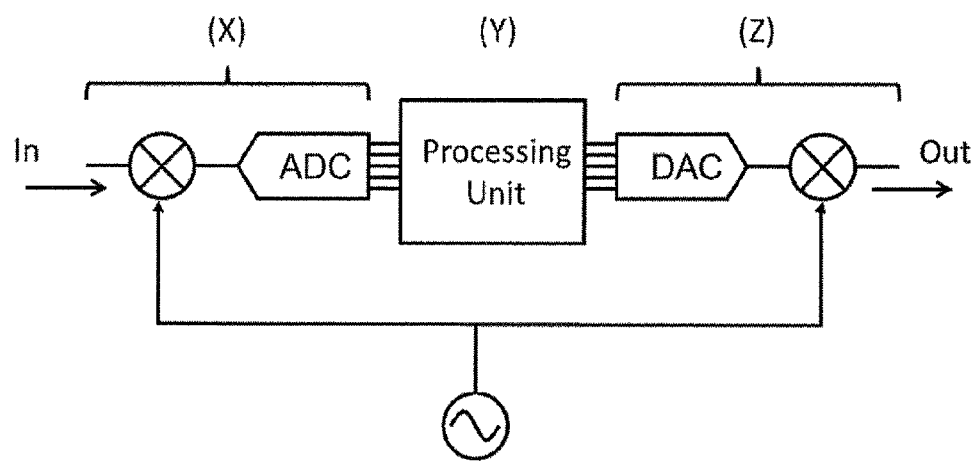
FIG. 13 illustrates the filtering functionality being implemented using a downconverter X—processing unit Y—upconverter Z.

The corrective circuitry ($H_c$) has a filter/amplifier purpose and can have different implementations. Some possibilities are illustrated in FIG. 12. Either one can have only an amplifier or a filter-amplifier or amplifier-filter or filter-amplifier-filter. It is possible to use physically more amplifier and filter blocks with interchangeable positions to realize the functionality of the corrective circuitry. The filter can be implemented using different technologies. One approach is to implement the filter or part of the filter functionality using digital techniques. FIG. 13 shows how the filter or part of the filtering functionality can be implemented using a downconverter X—processing unit Y—upconverter Z. The processing unit Y could be implemented in FPGA technology.

The present invention introduces innovative topologies for actively improved impedance synthesis. The basic topology is simple by synthesizing an impedance based on the attenuation and phase shift from a high reflective load. The invention presents a solution to overcome the unwanted losses and possible phase distortions of the tuning approach with an attenuator, phase shifter and high reflective load. In contrast to classic load-pull (FIG. 1) this topology does not allow to terminate in a power sensor because this is not a high reflective termination.

Figure 4:
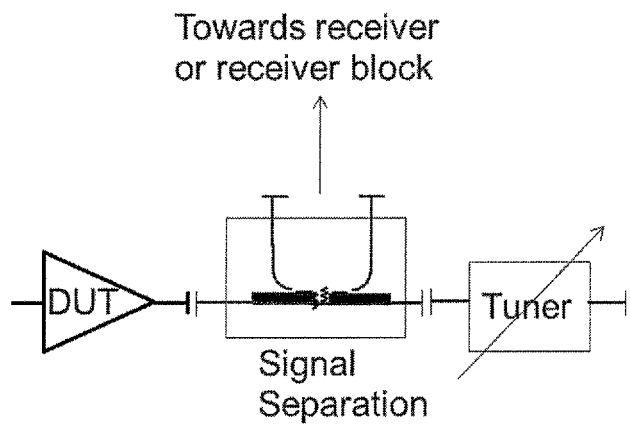
FIG. 4 represents a setup measuring the transmitted and reflected waves between the DUT and tuner.

The proposed approach can be used with set-ups as in FIG. 4 where there is probing hardware, measuring in one or another way incident and possibly reflected waves, between the DUT and the impedance synthesis. As such amongst others the power can still be measured. The present invention also allows correcting for the losses created by the inserted probing hardware.

The topologies as shown in FIGS. 6 to 11 are possibly accompanied by a processing unit to set the attenuation, phase shift and maybe the parameters of the corrections in the parallel branch to synthesize an impedance at one or more frequencies. Depending on the selected topology the corrections in the parallel branch can be independent of the requested impedance and can only depend on the unwanted losses and phase shifts. As such the correction does not need to be adapted as different impedances are being synthesized.

The proposed solution is very suited to build a tuning device on a printed circuit board using variable attenuator chips, variable phase chips, amplifier chips and coupler chips. The latter are nowadays commonly available. This results in a compact circuit that can be put very closely to the device under test on a printed circuit board, limiting the losses, to create reasonable reflection factors. As such this approach is very interesting to perform impedance tuning on amplifier chips as device under test. It is very compact and can be integrated on an evaluation board.

The presented tuning device can also be combined with a vector network analyzer, a large-signal network analyzer or a nonlinear vector network analyzer to perform load-pull measurements on a device under test.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An impedance control device for tuning a device under test comprising
    a first terminal port arranged for connecting a device under test,
    a high reflective termination connected to a second terminal port,
    a first signal path for a signal travelling between said first and said second terminal port, said first signal path comprising an attenuator and a phase shifter,
    first coupling means arranged for picking up a part of said signal travelling in said first signal path,
    a second signal path arranged for receiving said part of said signal from said first coupling means, said second signal path comprising a correction circuit for applying attenuation and phase shifting to said signals travelling either towards the device under test or away from the device under test between said first terminal port and said second terminal port, and
    second coupling means arranged for coupling back into said first signal path an adapted signal output by said correction circuit.

2. The impedance control device as in claim 1, wherein said attenuator and said phase shifter are positioned outside the signal path between the first and second coupling means.

3. The impedance control device as in claim 1, wherein said correction circuit comprises filtering means for adapting the amplitude and phase of said received part of said signal.

4. The impedance control device as in claim 3, wherein said correction circuit further comprises an amplification means.

5. The impedance control device as in claim 3, wherein said correction circuit comprises digital synthesis means for correcting the amplitude and phase response of said impedance control device as function of the frequency.

6. The impedance control device as in claim 5, wherein said digital synthesis means is implemented at least in part with a field programmable gate array.

7. The impedance control device as in claim 5, wherein said correction circuit comprises a processing unit for correcting the amplitude and phase response of the impedance control device as function of the frequency.

8. A vector network analyser comprising an impedance control device, the impedance control device comprising:
    a first terminal port arranged for connecting a device under test,
    a high reflective termination connected to a second terminal port,
    a first signal path for a signal travelling between said first and said second terminal port, said first signal path comprising a attenuator and a phase shifter,
    first coupling means arranged for picking up a part of said signal travelling in said first signal path,
    a second signal path arranged for receiving said part of said signal from said first coupling means, said second signal path comprising a correction circuit for applying attenuation and phase shifting to said signals travelling either towards the device under test or away from the device under test between said first terminal port and said second terminal port, and
    second coupling means arranged for coupling back into said first signal path an adapted signal output by said correction circuit.

* * * * *